United States Patent [19]

Tedrow et al.

[11] Patent Number: 5,426,391
[45] Date of Patent: Jun. 20, 1995

[54] METHOD AND APPARATUS FOR PROVIDING SELECTABLE SOURCES OF VOLTAGE

[75] Inventors: Kerry D. Tedrow, Orangevale; Jahanshir J. Javanifard, Sacramento; Mase J. Taub, Elk Grove, all of Calif.

[73] Assignee: Intel Corporation, Santa Clara, Calif.

[21] Appl. No.: 355,102

[22] Filed: Dec. 13, 1994

Related U.S. Application Data

[63] Continuation of Ser. No. 119,869, Sep. 10, 1993, abandoned.

[51] Int. Cl.$^6$ .............................. G11C 700; G11C 16/02
[52] U.S. Cl. ..................................... 327/530; 365/226; 365/227; 365/229
[58] Field of Search ................... 365/52, 189.01, 226, 365/227, 229, 230.01, 900; 307/296.1

[56] References Cited

U.S. PATENT DOCUMENTS

| | | | |
|---|---|---|---|
| 5,153,854 | 10/1992 | Harold | 365/189.01 |
| 5,157,278 | 10/1992 | Min et al. | 327/534 |
| 5,216,588 | 6/1993 | Bajwa et al. | 365/226 |
| 5,243,561 | 9/1993 | Yamauchi | 365/189.12 |
| 5,245,572 | 9/1993 | Kosonocky et al. | 365/185 |
| 5,267,218 | 11/1993 | Elbert | 365/189.01 |
| 5,276,646 | 1/1994 | Kim et al. | 365/226 |
| 5,313,429 | 5/1994 | Chevallier et al. | 365/226 |

OTHER PUBLICATIONS

1992 IEEE International Solid-State Circuits Conference, ISSCC 92 Session 9/Non-Volatile and Dynamic RMAS/Paper 9.3, "TP9.3: A 5V-Only 0.6 μm Flash EEPROM with Ros Decoder Scheme in Triple-Well Structure," Masao Kurlyama, et al., pp. 152–153, 270.

*Primary Examiner*—William L. Sikes
*Assistant Examiner*—Fetsum Abraham
*Attorney, Agent, or Firm*—Blakely, Sokoloff, Taylor & Zafman

[57] ABSTRACT

An integrated circuit including an operating circuit portion which requires a predetermined voltage in order to function properly, a charge pump circuit for providing a high voltage output equal to the predetermined voltage from a lower voltage input, a terminal for receiving voltage from a source of external voltage, and a circuit for selectively providing voltage to the operating circuit portion of the integrated circuit from the terminal if the level of voltage detected at the terminal from the external voltage source is above the predetermined voltage and for providing voltage to the operating circuit portion from the output of the charge pump if the voltage detected at the terminal is less than the predetermined level.

4 Claims, 4 Drawing Sheets

METHOD AND APPARATUS FOR PROVIDING SELECTABLE SOURCES OF VOLTAGE

This is a continuation of application Ser. No. 08/119,869, filed Sep. 10, 1993 and abandoned on 12/13/94.

BACKGROUND OF THE INVENTION

1. Field Of The Invention

This invention relates to computer systems and, more particularly, to methods and apparatus for providing high voltages for erasing and programing memory arrays from either an internal or an external source of voltage.

2. History Of The Prior Art

It has been found that the use of computers has grown so extensive that the power used by these computers has become significant. In order to reduce the cost of operation as well as the consequent use of energy resources, a substantial move is underway to reduce this power usage. In fact, a major trend in the manufacture of personal computers is to reduce the voltage level required to operate the integrated circuits which are used in the various components of those computers. There has also been a simultaneous trend to provide portable computers which function for extended periods. This has also led to attempts to reduce the power used by portable computers.

In order to reduce power consumption and extend battery life, much of the integrated circuitry used in personal computers is being redesigned to run at low voltage levels. This reduces the power usage and allows more components to be placed closer to one another in the circuitry. The circuitry and components used in portable computers are being designed to operate at voltages levels such as five volts and 3.3 volts. This helps a great deal to reduce the power needs of personal computers.

However, at the same time, the desire to offer more features in portable computers opposes this salutary result. Many of these features require higher voltages to function. For example, one real convenience is the ability to change the basic input/output (BIOS) processes as improvements in a computer or its peripherals occur. Historically, this has been accomplished by removing the electrically programmable read only memory (EPROM) or similar circuitry which provides the read only memory for storing the BIOS processes and replacing it with new circuitry at additional cost. This is a complicated operation beyond the abilities of many computer users. Recently, flash electrically-erasable programmable read only memory (flash EEPROM memory) has been used to store BIOS processes. This memory may be erased and reprogrammed without removing the BIOS circuitry from the computer by running a small update program when the BIOS processes are changed. However, reprogramming flash EEPROM memory requires approximately twelve volts to accomplish effectively; and the lower voltage batteries provided in personal computers are not capable of furnishing this voltage.

Another type of flash EEPROM memory array provides an additional example of high voltage requirements in portable computers. Recently, a new form of long term random access storage has been devised using flash EEPROM memory arrays. An example of a flash EEPROM memory array which may be used in place of a hard disk drive is given in U.S. patent application Ser. No. 07/969,131, entitled *A Method and Circuitry For A Solid State Memory Disk*, S. Wells, filed Oct. 31, 1992, and assigned to the assignee of the present invention. These arrays provide a smaller lighter functional equivalent of a hard disk drive which operates more rapidly and is not as sensitive to physical damage. Such memory arrays are especially useful in portable computers where space is at a premium and weight is important.

However, these flash EEPROM memory arrays also require much higher voltages for programming and erasing data than can be provided directly by the batteries of portable computers. Although it has been typical to provide charge pumps to generate higher voltage in circuitry in which batteries do not provide sufficient voltages, this has not been possible with flash EEPROM memory arrays. Now a new arrangement has been devised by which charge pump circuitry may be integrated with a flash EEPROM memory array and used to generate the high voltages necessary for programming and erasing such an array. A detailed description of one such charge pump is furnished in U.S. patent application Ser. No. 08/119,423, entitled *Method and Apparatus for A Two Phase Bootstrap Charge Pump*, K. Tedrow et al, filed on even date herewith, and assigned to the assignee of the present invention.

It has been found to be very desirable that the circuitry by which erasing and programming of flash EEPROM memory arrays is accomplished be capable of utilizing erasing and programming voltages either generated internally by charge pump circuitry from a low voltage level external source or, alternatively, provided externally from a high voltage level source.

SUMMARY OF THE INVENTION

It is, therefore, an object of the present invention to provide integrated circuitry capable of providing sufficient power to effectively erase and program flash EEPROM memory arrays from either internal or external sources of power.

It is another, more specific, object of the present invention to provide a circuit for erasing and programming voltages selecting either from a charge pump circuit associated with the flash EEPROM memory array or from an external high voltage source.

These and other objects of the present invention are realized in an integrated circuit which includes an integrated circuit charge pump circuit and an external source of high voltage. The circuitry also includes circuitry for testing whether an external source of high voltage exists and selecting that external source for providing erasing and programming voltages when the external source exists.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
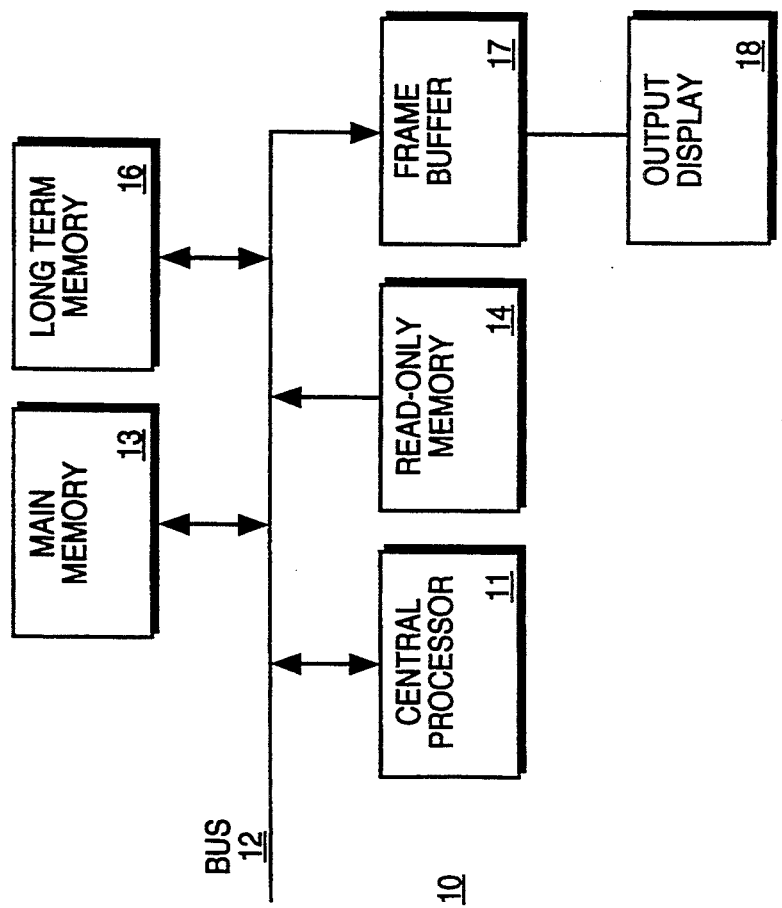
FIG. 1 is a block diagram illustrating a computer system including the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition even in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. Typically, such flash EEPROM memory will include circuitry for programming and erasing the memory array. If the memory 14 is constructed of flash EEPROM memory cells, it may be modified by running an update process on the computer itself to reprogram the values stored in the memory 14. Also connected to the bus 12 are various peripheral components such as long term memory 16 and circuitry such as a frame buffer 17 to which data may be written which is to be transferred to an output device such as a monitor 18 for display. The construction and operation of long term memory 16 (typically electro-mechanical hard disk drives) is well known to those skilled in the art. However, rather than the typical electro-mechanical hard disk drive, a flash EEPROM memory array may be used as the long term memory 16. Such flash EEPROM memory arrays are programmed and erased through techniques which utilize voltages greater than that typically available to the integrated circuits of more advanced portable computers. Such flash EEPROM memory arrays may include circuitry for programming and erasing the memory array. Consequently, such long term memory arrays as well as memory 14 may provide circuitry for generating high voltages from the lower voltages available from their batteries such as the invention described in the copending patent application entitled *Method and Apparatus for A Two Phase Bootstrap Charge Pump*, referred to above. Such circuits may also have available external sources of high voltage which may be used for programming and erasing flash EEPROM memory arrays.

A flash EEPROM memory array is made up of memory cells which include floating gate field effect transistor devices. Such memory transistors may be programmed to change the charge stored on the floating gate, and the condition (programmed or erased) may be detected by interrogating the cells. The conventional method of erasing an array of flash EEPROM memory cells erases all of the cells together (or at least some large block thereof). Typically, this requires the application of twelve volts to the source terminals of all of the memory cells, grounding the gate terminals, and floating the drain terminals. The programming of memory cells is typically accomplished a word at a time but conventionally requires that the drain of selected cells be placed at six or seven volts, the gate at eleven or twelve volts, and the source be grounded. Although it has been typical to provide charge pumps to generate higher voltages in circuitry in which batteries do not provide sufficient voltages, this has not been possible with flash EEPROM memory arrays. Although such charge pumps are able to increase the voltage to an appropriate level, prior art charge pumps do not provide sufficient current to generate the power for effectively erasing and programming flash EEPROM memory when erased in the conventional manner.

A new charge pump circuit has been devised which is capable of providing the high voltages and currents which are required to program and erase flash EEPROM memory arrays. The copending patent application referred to above entitled *Method and Apparatus for A Two Phase Bootstrap Charge Pump* describes that charge pump circuit. Such a charge pump circuit is also described in detail hereinafter.

Figure 2:
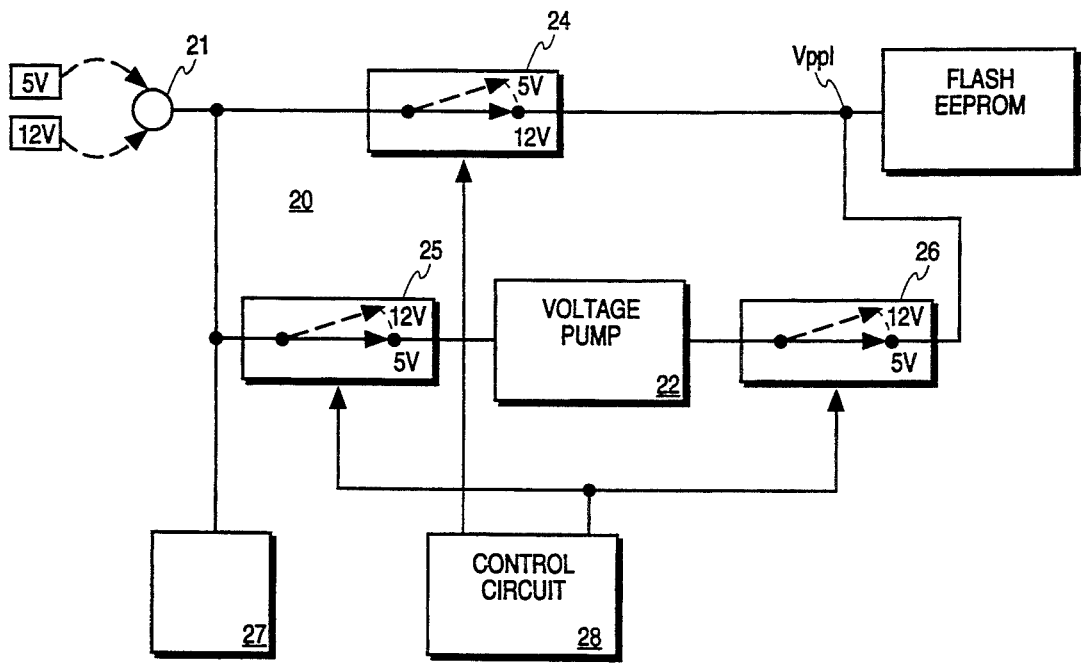
FIG. 2 is a block diagram of a circuit arrangement designed in accordance with the present invention.
Figure 5:
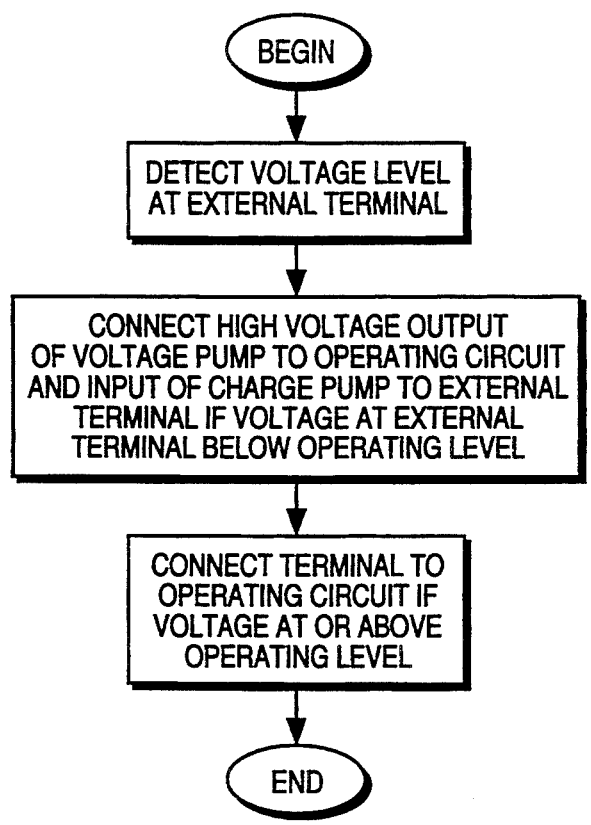
FIG. 5 is a flow chart describing a method in accordance with the present invention.

FIG. 2 is a block diagram illustrating a circuit arrangement 20 designed in accordance with the present invention. FIG. 5 is a flow chart which describes the operation of the arrangement 20. The arrangement 20 includes a terminal 21 which receives voltage from a source of external voltage. The source of voltage connected to the terminal 21 may be a twelve volt source capable of furnishing whatever current is necessary for programing and erasing a flash EEPROM memory array. Alternatively, the source of voltage connected to the terminal 21 may be a source of a lower voltage such as five volts which must be used to generate a higher voltage within the circuit arrangement 20. The arrangement 20 also includes a charge pump circuit 22 designed in accordance with the principles described in the co-pending patent application to generate from an external voltage of five volts an internal voltage of approximately twelve volts with a current sufficient to erase flash EEPROM memory arrays. A circuit essentially identical to that illustrated in FIG. 2 may also be used to generate from an external voltage of five volts an internal voltage of approximately nine volts with a current sufficient to program flash EEPROM memory arrays.

Either of the voltages available at the terminal 21 or at the output of the charge pump circuit 22 may be provided to an output terminal designated VppI (internal high voltage) in the figure. Which of these voltages is applied depends on the availability of the external high voltage (twelve volt) source at the terminal 21. If the high voltage external source is available to the computer (or other) system at the terminal 21, then a first switch 24 is closed to connect the source at the terminal 21 to the output terminal VppI. Simultaneously, a pair of switches 25 and 26 are each opened to disconnect the charge pump circuit 22 from the output terminal VppI. If the source of high voltage is not available but only five volts is available at the terminal 21, then the switch 24 is opened while the switches 25 and 26 are closed to connect the charge pump circuit 22 between the output terminal VppI and the input terminal 21 at which the lower voltage is available.

In order to test the presence of the high voltage at the terminal 21, a test circuit 27 is provided. The circuit 27 is a voltage level detector which monitors the value of the voltage available at the terminal 21 and controls the closure of the switches 24, 25 and 26 which connect the different sources to the output terminal VppI. The circuit 27 may be designed in a manner well known to those skilled in the art to produce a voltage level detector. One such arrangement is described in detail in U.S. patent application Ser. No. 08/003,618, entitled *Circuitry for Power Supply Voltage Detection And System Lockout For A Nonvolatile Memory*, M. Landgraf, filed Jan. 13, 1993, and assigned to the assignee of the present invention. If the voltage is at the high level (e.g., twelve volts), then the circuit 27 causes a controller circuit 28 to operate the switches in the manner discussed in order to provide the correct voltage from the terminal 21 at the output terminal VppI. If on the other hand, the voltage at the terminal 21 is the lower level (e.g., five volts), then the circuit 27 provides signals to cause the controller 28 to operate the switches 24, 25, and 26 to connect the output of the charge pump source 22 to the output terminal VppI.

In the preferred embodiment of the invention, the controller circuit 28 may be an integrated circuit processor such as that disclosed in U.S. patent application Ser. No. 08/086,186, entitled *Flash Memory Array System and Method*, M. Fandrich et al, filed Jun. 30, 1993, and assigned to the assignee of the present invention. Such a device may be programmed to respond to particular control signals to provide signals to open and close particular switching devices such as the switches 24, 25, and 26 used in the circuit arrangement 21 in the manner described above. It should be noted that it is not necessary to include a device as powerful as the microprocessor of the preferred embodiment in order to response to a signal from the circuit 27 and operate the switches 24, 25, and 26 in the manner described above; less capable control circuits and state machines may be designed by those skilled in the art to accomplish this purpose.

Figure 3:
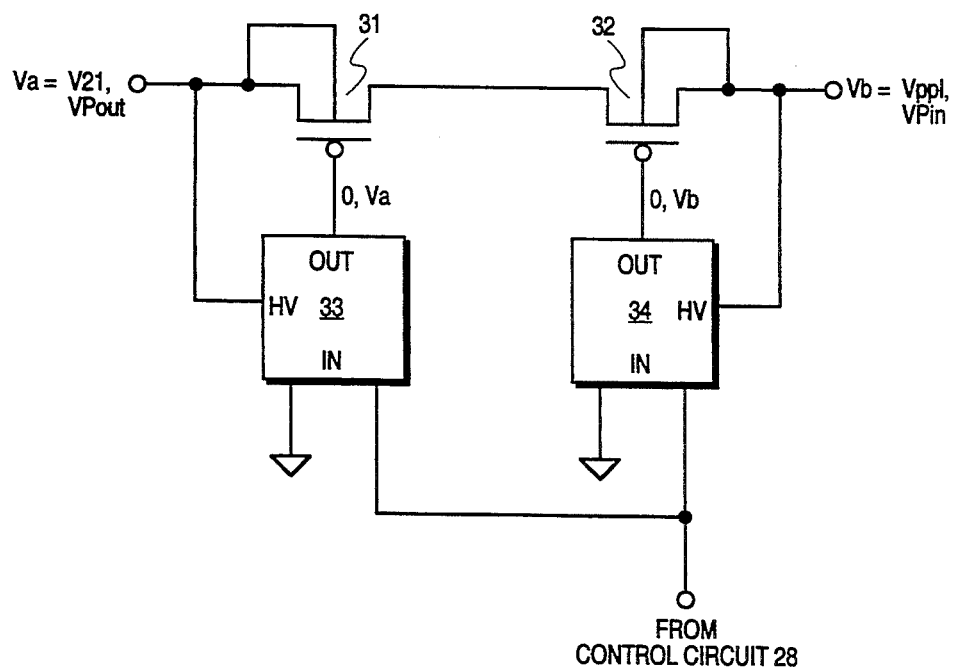
FIG. 3 is a circuit diagram illustrating a circuit for providing a portion of the block diagram of FIG. 2.

FIG. 3 illustrates a switch which may be utilized in the circuit of FIG. 2 in order to provide appropriate switching capabilities for each of the switches 24, 25, and 26. Because N channel field effect transistor devices do not provide a sufficiently high voltage because of the necessity to bias the gate at too high a value in order to eliminate threshold loss, a P channel field effect transistor device must be used. Moreover, if a typical single P device switch were to be used, the biasing provided would be improper in some conditions because the value of the voltages at the terminal 21 and the output of the charge pump 22 varies so that the switches would function improperly. Therefore, a pair of P devices 31 and 32 are connected in what is referred to as a back-to-back arrangement. To turn on the devices 31 and 32, the gates are taken to zero volts. To turn off the devices, the gates are each connected to the closest source of high voltage adjacent to the gate terminal. Thus, with the switch 26, to turn off the device 31 when it is connected to the output of the charge pump and to the terminal VppI, the gate of the device 31 is connected to the voltage at the output of the charge pump. At the same time, the gate terminal of the device 32 (when connected to the terminal VppI) is connected to a voltage Vb at the same terminal VppI. This arrangement assures that the gate of each device is at a value as high as the highest drain or source terminal of the device and isolates the terminal between the two devices 31 and 32.

In order to provide the high and low values of voltage to each of the gates of the devices 31 and 32 of each of the switches, level shifters 33 and 34 are used. Each level shifter 33 and 34 receives a digital input signal from the control circuit 28 and provides the appropriate value to the devices 31 and 32 to enable or disable the devices. For example, if the input signal is a low value, ground may applied by the level shifter to the gate of the associated device. If the input signal is a high value, the voltage (Va or Vb) provided at the immediately adjacent terminal is applied to the gate. The switches 25 and 26 are arranged to respond in the opposite sense as does the switch 24 so that the switches 25 and 26 close when the switch 24 opens and open when the switch 24 closes.

It should also be noted that the preferred embodiment of the P devices utilized as the switches 31 and 32 are especially designed and are sometimes referred to as O devices. U.S. patent application Ser. No. 07/804,093, entitled *A High Voltage MOS Transistor For Flash EE-PROM Applications Having A Unisided Lightly Doped Drain*, Sery et al, filed Dec. 6, 1991, and assigned to the assignee of the present invention describes such devices in detail. For the purpose of the present specification, O devices are P channel field effect transistor devices which have thicker gate oxide layers which are devised to tolerate the voltages applied to such devices over the lifetime of the part without oxide layer breakdown. Typically such an oxide layer is greater than 190 angstroms and often as thick as 300 angstroms.

Figure 4:
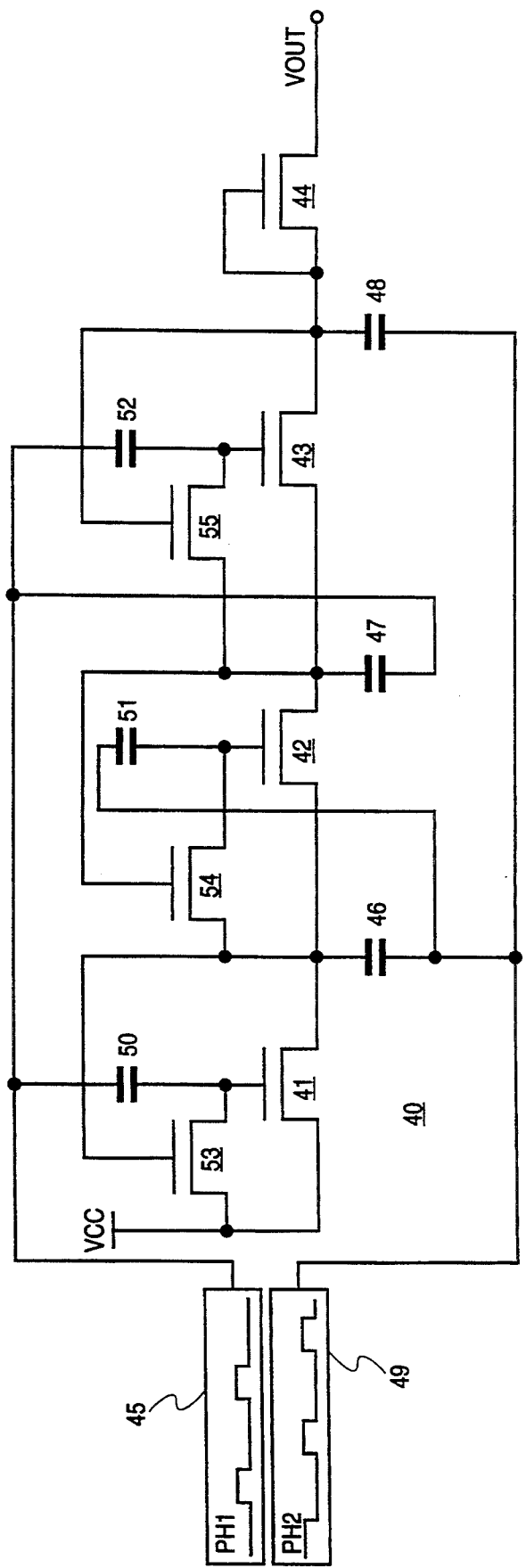
FIG. 4 is a circuit diagram illustrating a circuit for providing another portion of the block diagram of FIG. 2.

The circuit 40 illustrated in FIG. 4 is a charge pump circuit which may be used as the charge pump 22 of FIG. 2. The circuit 40 includes a number of stages of N type field effect transistors 41, 42, 43, and 44 connected in series between a source of voltage Vcc and an output terminal Vout. In the preferred embodiment of the circuit, the transistors 41, 42, and 43 as well as the other transistors are special N type devices referred to as S type devices. S type devices are basically N type devices having a very low threshold voltage level. Each stage of the circuit 40 except the last or output stage also includes an N channel field effect transistor device 53, 54, or 55 connected to the gate terminal of the device 41, 42, or 43 of that stage.

The circuit 40 includes two sources of clock pulses 45 and 49 which produces the clock pulses illustrated in FIG. 4. These clock pulses are applied in a unique manner in order to allow the operation of the circuit 40 to produce the desired output voltages and currents. The two phases of input clock signals (phase 1 and phase 2) are furnished to the circuit 40 from sources 45 and 49 via capacitors 47, 50, and 52 and also by capacitors 46, 48, and 51.

The pulses of the phase 1 and 2 clock pulse trains which are applied to the gate and drain terminals of the switching devices 41, 42, and 43 turn on those devices in sequential order. Similarly, the pulses of the phase 1 and 2 clock pulse trains which are applied to the gate terminals of the control devices 53, 54, and 55 turn on those devices sequentially. The control device of each stage, however, is turned off during most of the time the associated switching device 41, 42, or 43 of that stage is conducting. This disconnects the gate and drain terminals of the stage while the device is conducting allowing the gate to reach a higher voltage than the drain and operate the device in a region in which there is no threshold voltage drop (Vt). The lack of threshold drop increases the amount of current which the charge pump circuit is able to produce to approximately twice the current of a more conventional charge pump.

Thus, when the phase 1 clock goes high, the device 41 turns on; and current provided by the source Vcc charges the capacitor 46. When the phase 1 pulse goes low the device 41 switches off. Then the phase 2 clock pulse turns on the device 42; and the voltage on the capacitor 46 due to charging from the source Vcc and the positive phase 2 pulse causes the charge stored on the capacitor 46 to begin to charge the capacitor 47. The device 42 switches off when the phase 2 pulse goes low. When the phase 1 pulse again goes high, the source Vcc again charges the capacitor 46. Simultaneously, the device 43 switches on; and the voltage on the capacitor 47 due to charging from the capacitor 46 and the positive phase 1 clock pulse begins to charge a capacitor 48. When the phase 1 clock goes low, the device 43 turns off. Ultimately, the charging of the capacitor 48 and a positive phase 2 clock pulse raise the voltage level on the capacitor 48 sufficiently above the level Vout to cause the conduction of the switching device 44. When the output device 44 turns on, a pumped voltage is furnished at Vout equal approximately to the number of stages plus one multiplied by the value of Vcc (e.g., five volts). This provides the desired output voltage while furnishing the high level of current necessary to erase and program flash EEPROM memory arrays.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A voltage generation integrated circuit, comprising:
   (A) an input terminal for receiving an input voltage;
   (B) a charge pump circuit having a pump input and a pump output;
   (C) an output terminal;
   (D) a control circuit for providing a first and a second control signal in accordance with a level of the input voltage;
   (E) a first switch coupled between the pump output and the output terminal;
   (F) a second switch coupled between the input terminal and the pump input, wherein the first and second switches are responsive to the first control signal;
   (G) a third switch coupled between the input and output terminals, wherein the third switch is responsive to the second control signal, wherein each of the first, second, and third switches further comprises:
      (i) a first P-channel field effect transistor, a source of the first transistor forming a switch input;
      (ii) a second P-channel field effect transistor, a drain of the first transistor coupled to a drain of the second transistor, a source of the second transistor forming a switch output;
      (iii) a first voltage level shifter for selectively coupling a gate of the first transistor to one of the source terminal of the first transistor and a ground terminal in response to a respective one of the first and second control signals; and
      (iv) a second voltage level shifter for selectively coupling a gate of the second transistor to one of the source terminal of the second transistor and the ground terminal in response to the respective one of the first and second control signals.

2. The voltage generation integrated circuit of claim 1 in which the predetermined voltage magnitude is approximately 12 volts.

3. The voltage generation integrated circuit of claim 1, wherein the output terminal is coupled to an operating circuit, wherein the operating circuit further comprises an electrically programmable and erasable memory array.

4. The voltage generation integrated circuit of claim 1, wherein when the input voltage exceeds a predetermined voltage magnitude, then (1) the first and second switches decouple the charge pump from the input and output terminals and (2) the third switch couples the input terminal to the output terminal in response to the first and second control signals, wherein when the voltage does not exceed the predetermined voltage magnitude, then (1) the first and second switches couple the charge pump to the input and output terminals and (2) the third switch decouples the input terminal from the output terminal in response to the first and second control signals.

* * * * *